(12) United States Patent
Shen et al.

(10) Patent No.: US 7,867,848 B2
(45) Date of Patent: Jan. 11, 2011

(54) METHODS FOR FABRICATING DUAL BIT FLASH MEMORY DEVICES

(75) Inventors: Minghao Shen, Sunnyvale, CA (US); Fred Cheung, San Jose, CA (US); Ning Cheung, San Jose, CA (US); Wei Zheng, Santa Clara, CA (US); Hiroyuki Kinoshita, San Jose, CA (US); Chih-Yuh Yang, San Jose, CA (US)

(73) Assignee: Spansion, LLC, Sunnyvale, CA (US)

( * ) Notice: Subject to any disclaimer, the term of this patent is extended or adjusted under 35 U.S.C. 154(b) by 0 days.

(21) Appl. No.: 12/765,646

(22) Filed: Apr. 22, 2010

(65) Prior Publication Data

US 2010/0203694 A1 Aug. 12, 2010

Related U.S. Application Data

(62) Division of application No. 11/410,695, filed on Apr. 24, 2006.

(51) Int. Cl.
*H01L 21/8239* (2006.01)
(52) U.S. Cl. .......... 438/261; 257/E21.21; 257/E21.645
(58) Field of Classification Search .......... 438/194, 438/257, 261, 264, 266; 257/E21.21, E21.423, 257/E21.623, E21.637, E21.645, E21.679, 257/E29.309, E29.331
See application file for complete search history.

(56) References Cited

U.S. PATENT DOCUMENTS

| | | | |
|---|---|---|---|
| 6,524,913 B1 | 2/2003 | Lin et al. |
| 6,639,271 B1 | 10/2003 | Zheng et al. |
| 6,861,307 B2 | 3/2005 | Zheng et al. |
| 6,917,068 B1 | 7/2005 | Krivokapic |
| 6,962,849 B1 | 11/2005 | Kamal et al. |
| 2004/0021172 A1 | 2/2004 | Zheng et al. |
| 2006/0240635 A1 | 10/2006 | Shiraiwa et al. |

*Primary Examiner*—Davienne Monbleau
*Assistant Examiner*—Monica D Harrison

(57) ABSTRACT

Methods for fabricating dual bit memory devices are provided. In an exemplary embodiment of the invention, a method for fabricating a dual bit memory device comprises forming a charge trapping layer overlying a substrate and etching an isolation opening through the charge trapping layer. An oxide layer is formed overlying the charge trapping layer and within the isolation opening. A control gate is fabricated overlying the isolation opening and portions of the charge trapping layer adjacent to the isolation opening. The oxide layer and the charge trapping layer are etched using the control gate as an etch mask and impurity dopants are implanted into the substrate using the control gate as an implantation mask.

15 Claims, 6 Drawing Sheets

METHODS FOR FABRICATING DUAL BIT FLASH MEMORY DEVICES

CROSS REFERENCES TO RELATED APPLICATIONS

This patent application is a Divisional Application of U.S. patent application Ser. No. 11/410,695, filed Apr. 24, 2006.

FIELD OF THE INVENTION

The present invention generally relates to flash memory devices, and more particularly relates to methods for fabricating dual bit memory devices that reduce bitline implant diffusion problems.

BACKGROUND OF THE INVENTION

A type of commercially available flash memory product is a MirrorBit® memory device available from Spansion, LLC, located in Sunnyvale, Calif. A MirrorBit cell effectively doubles the intrinsic density of a flash memory array by storing two physically distinct bits on opposite sides of a memory cell. Each bit within a cell can be programmed with a binary unit of data (either a logic one or zero) that is mapped directly to the memory array.

A portion of an exemplary MirrorBit® memory device 10, illustrated in FIG. 1, includes a P-type semiconductor substrate 12 within which are formed spaced-apart source/drain regions 14, 16 respectively (both typically having N-type conductivity), otherwise known as bitline regions or bitlines. A charge trapping layer or stack 18 is disposed on the top surface of the substrate between the bitlines. The charge trapping stack 18 typically comprises, for example, a charge trapping layer, often a silicon nitride layer 20, disposed between a first or bottom silicon dioxide layer (commonly referred to as a tunnel oxide layer) 22 and a second or top silicon dioxide layer 24. A gate electrode 26, which typically comprises an N or N+ polycrystalline silicon layer, is formed over the charge trapping stack. An isolation region 40 divides the charge trapping stack below each gate electrode 26 to form a first storage element or bit 28 and a complementary second storage element or bit 30 of memory cells 32 and 34.

Dual bit memory cell 34 is programmed utilizing a hot electron injection technique. More specifically, programming of the first bit 28 of memory cell 34 comprises injecting electrons into the charge trapping layer 20 and applying a bias between bitlines 14 and 16 while applying a high voltage to the control gate 26. In an exemplary embodiment, this may be accomplished by grounding bitline 16 and applying approximately 5 V to bitline 14 and approximately 10 V to the control gate 26. The voltage on the control gate 26 inverts a channel region 36 while the bias accelerates electrons from bitline 14 into the channel region 36 towards bitline 16. The 4.5 eV to 5 eV kinetic energy gain of the electrons is more than sufficient to surmount the 3.1 eV to 3.5 eV energy barrier at channel region 36/tunnel oxide layer 22 interface and, while the electrons are accelerated towards source/drain region 16, the field caused by the high voltage on control gate 26 redirects the electrons towards the charge trapping layer 20 of first bit 28. Those electrons that cross the interface into the charge trapping layer remain trapped for later reading.

Similarly, programming the second bit 30 by hot electron injection into the charge trapping layer 20 comprises applying a bias between bitlines 16 and 14 while applying a high voltage to the control gate 26. This may be accomplished by grounding bitline 14 and applying approximately 5V to bitline 16 and approximately 10 V to the control gate 26. The voltage on the control gate 26 inverts the channel region 36 while the bias accelerates electrons from bitline 16 into the channel region 36 towards bitline 14. The field caused by the high voltage on control gate 26 redirects the electrons towards the charge trapping layer 20 of second bit 30. Those electrons that cross the interface into charge trapping layer 20 of second bit 30 remain trapped for later reading.

As devices densities increase and product dimensions decrease, it is desirable to reduce the size of the various structures and features associated with individual memory cells, sometimes referred to as scaling. However, the fabrication techniques used to produce flash memory arrays limit or inhibit the designer's ability to reduce device dimensions. For example, with 65 nm node devices, it is not necessary to isolate portions of the charge trapping layer of complimentary bits, that is, isolation regions 40 in cells 32 and 34 are not necessary. However, as device dimensions decrease to 45 nm nodes, isolation of the charge trapping layer portions of the complimentary cells by isolation regions 40 becomes advantageous. A convenient method for forming memory device 10 with isolation regions 40 includes forming bitline regions 14 and 16 before forming the gate stacks of cells 32 and 34. However, subsequent high temperature processes such as, for example, thermal oxidation formation or high temperature oxide (HTO) deposition, have a tendency to result in lateral diffusion of the implanted ions of the bitlines. Such diffusion may result in interference between the adjacent bitlines and, hence, degradation of device performance.

Accordingly, it is desirable to provide methods of fabricating dual bit memory devices that permit formation of the bitline regions after formation of the gate stacks, thus minimizing or reducing bitline implant diffusion during manufacture. In addition, it is desirable to provide methods of fabricating flash memory devices that provide better device performance. Furthermore, other desirable features and characteristics of the present invention will become apparent from the subsequent detailed description of the invention and the appended claims, taken in conjunction with the accompanying drawings and this

BRIEF SUMMARY OF THE INVENTION

In accordance with an exemplary embodiment of the present invention, a method for fabricating a dual bit memory device comprises forming a charge trapping layer overlying a substrate and etching an isolation opening through the charge trapping layer. An oxide layer is formed overlying the charge trapping layer and within the isolation opening. A control gate is fabricated overlying the isolation opening and portions of the charge trapping layer adjacent to the isolation opening. The oxide layer and the charge trapping layer are etched using the control gate as an etch mask and impurity dopants are implanted into the substrate using the control gate as an implantation mask to form an impurity doped bitline region within the substrate.

In accordance with another exemplary embodiment of the present invention, a method for fabricating a dual bit memory device comprises fabricating a charge trapping stack overlying a substrate, wherein the charge trapping stack comprises a tunnel oxide layer, a charge trapping layer overlying the tunnel oxide layer, and an insulating layer overlying the charge trapping layer. A plurality of sacrificial members are formed overlying the charge trapping layer and isolation openings are etched within the charge trapping layer between adjacent sacrificial members of the plurality of sacrificial members. An oxide layer is globally deposited overlying the plurality of sacrificial members, within the isolation openings, and overlying portions of the charge trapping layer and a plurality of control gates are formed overlying each of the isolation openings. The plurality of sacrificial members is removed and portions of the oxide layer and the charge trapping layer that do not underlie the plurality of control gates are etched. A plurality of impurity doped bitline regions is formed within the substrate using the plurality of control gates as a mask.

In accordance with a further exemplary embodiment of the present invention, a method for fabricating a flash memory device comprises fabricating a charge trapping stack overlying a silicon substrate. The charge trapping stack comprises a first dielectric layer, a charge trapping layer overlying the first dielectric layer, and a second dielectric layer overlying the charge trapping layer. An intermediate layer is deposited overlying the second dielectric layer and a sacrificial layer is deposited overlying the intermediate layer. Portions of the sacrificial layer are removed to form a plurality of sacrificial members and the intermediate layer is etched to expose portions of the second dielectric layer that do not underlie the sacrificial members. Isolation openings are etched through the second dielectric layer and the charge trapping layer using the sacrificial members as a mask. A first insulating material is deposited overlying the sacrificial members and within the isolation openings and control gates are fabricated between adjacent sacrificial members of the plurality of sacrificial members. The sacrificial members and the intermediate layer are removed. The first insulating material and the charge trapping layer are etched using the control gates as a mask and impurity doped bitline regions are formed within the substrate using the control gates as an implantation mask.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

In accordance with an exemplary embodiment of the present invention, FIGS. 2-15 illustrate a method for fabricating a dual bit memory device 50 that can be scaled with decreased device dimensions while overcoming challenges of bitline implant diffusion. By fabricating the bitline regions after formation of the memory cells, the bitline regions are subjected to fewer thermal cycles that may otherwise cause diffusion of the impurity dopants of the bitline regions. FIGS. 2-15 illustrate various cross-sectional views of dual bit memory device 50. Various steps in the manufacture of dual bit memory device 50 are well known and so, in the interest of brevity, many conventional steps will only be mentioned briefly herein or will be omitted entirely without providing well known process details.

Figure 1:
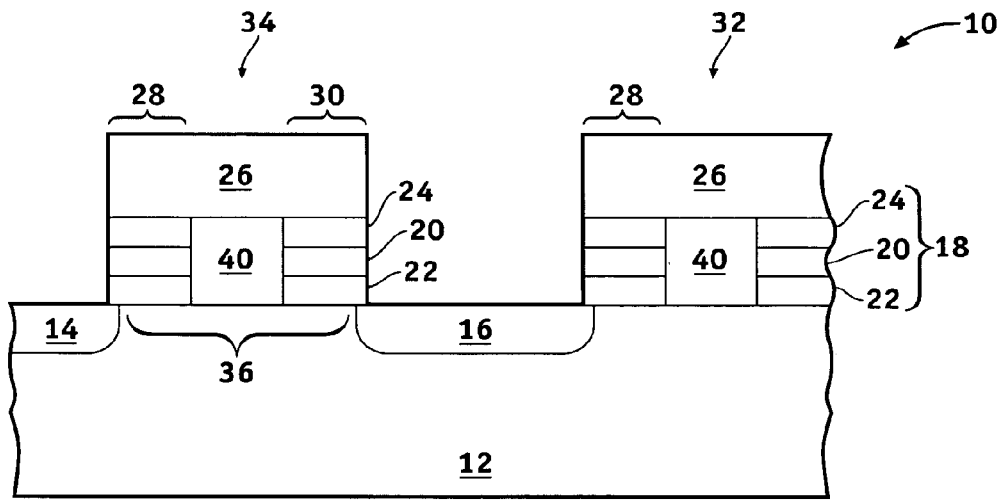
FIG. 1 is a cross-sectional view of a portion of a MirrorBit® dual bit memory device available from Spansion, LLC.
Figure 2:
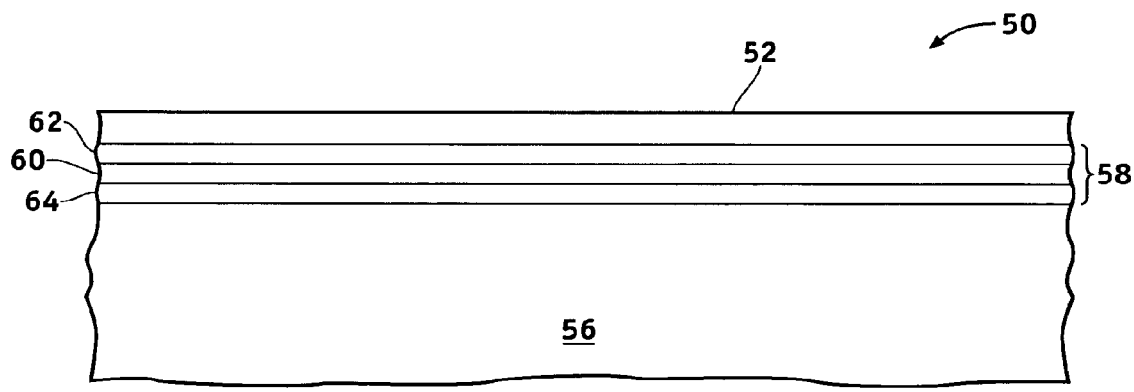
FIGS. 2-15 are cross-sectional views taken along the same axis that illustrate a method for fabricating a dual bit flash memory device, in accordance with an exemplary embodiment of the present invention.

As illustrated in FIG. 2, the manufacture of dual bit memory device 50 begins by providing a silicon substrate 56. As used herein, the term "silicon substrate" will be used to encompass the relatively pure silicon materials typically used in the semiconductor industry as well as silicon admixed with other elements such as germanium, carbon, and the like. The term "silicon substrate" also is used to encompass the substrate itself together with metal or insulator layers that may overly the substrate. Silicon substrate 56 may be a bulk silicon wafer or a thin layer of silicon on an insulating layer (commonly known as a silicon-on-insulator wafer or SOI wafer) that, in turn, is supported by a silicon carrier wafer.

A first silicon oxide layer 64, otherwise referred to as a tunnel oxide layer, and a charge trapping layer 60 of a multilayer dielectric-charge trapping-dielectric stack 58, such as for example a multilayer ONO stack, are formed overlying substrate 56. The two layers may be formed using any appropriate process steps and materials, including oxidation and/or deposition techniques as are known, such as thermal formation, chemical vapor deposition (CVD), low pressure chemical vapor deposition (LPCVD), plasma enhanced chemical vapor deposition (PECVD), or atomic layer deposition (ALD). In the case of oxide dielectrics, any of the oxide layers can include nitrogen or other dopants for optimal device and reliability performance. In addition, the nitride layer can be rich in Si, N, and/or dopants such as oxygen to facilitate enhanced device performance and reliability performance. Preferably, the charge trapping layer 60 comprises a silicon-rich silicon nitride. The layers comprising stack 58 can be any suitable multi-layer dielectric-charge trapping-dielectric stack, including, but not limited to, the ONO stack illustrated in FIG. 2 comprising first silicon oxide layer 64, silicon nitride layer 60 overlying first silicon oxide layer 64, and a second silicon oxide layer 62 overlying silicon nitride layer 60. Alternatively (although not illustrated), the layers of the completed multi-layer stack 58 overlying substrate 56 may comprise, for example, a first oxide layer overlying substrate 56, a nitride layer overlying the first oxide layer, and a high-dielectric constant charge blocking layer. In a preferred embodiment of the present invention, multi-layer stack 58 has a total thickness that is no greater than about 50 nm.

As illustrated in FIG. 2, an intermediate layer 52 is globally deposited overlying memory device 50. Intermediate layer 52 may comprise any suitable material that is different from the material of second silicon oxide layer 62 such as, for example, polycrystalline silicon. In a preferred embodiment of the invention, the intermediate layer 52 has a thickness in the range of about 100 to about 500 angstroms.

Figure 3:
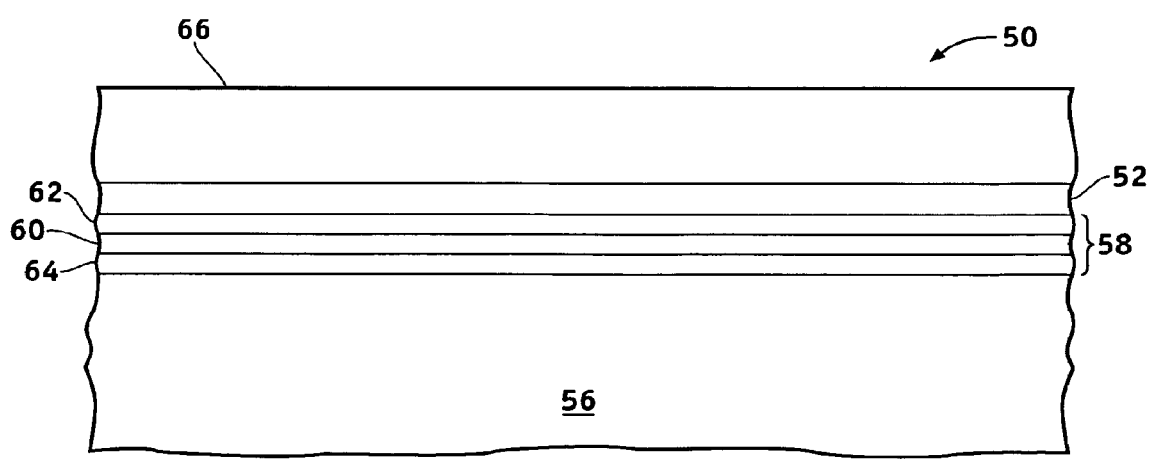

A sacrificial layer 66, preferably a material that is different from intermediate layer 52, for example, a silicon oxide layer, is deposited overlying the intermediate layer 52, as illustrated in FIG. 3. Sacrificial layer 66 may be formed using any appropriate process steps and materials, including oxidation and/or deposition techniques as are known, such as thermal deposition, chemical vapor deposition (CVD), low pressure chemical vapor deposition (LPCVD), plasma enhanced chemical vapor deposition (PECVD), or atomic layer deposition (ALD) and has a thickness in the range of about 300 to about 1000 angstroms.

Figure 4:
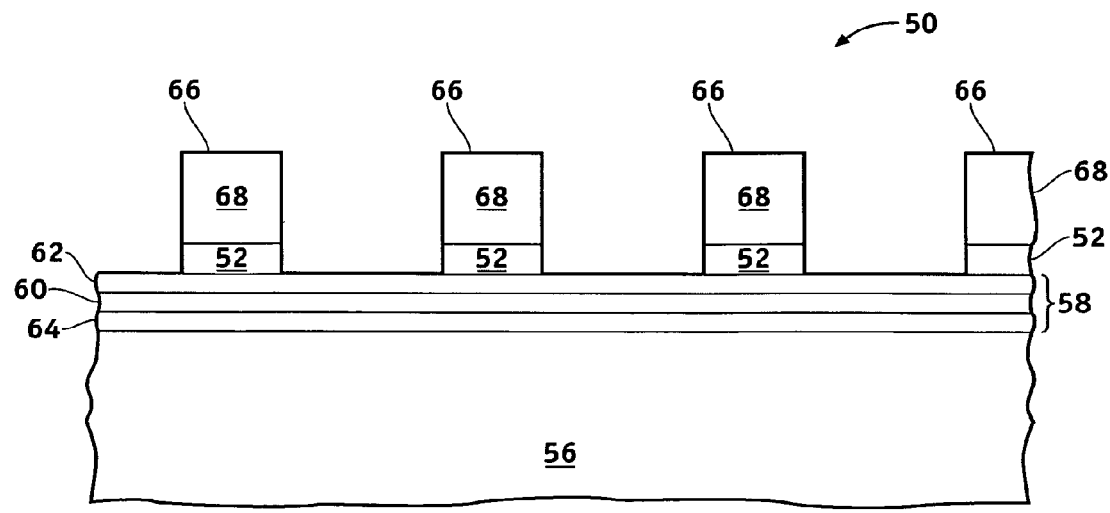

A photoresist layer (not shown) is deposited overlying memory device 50 and is suitably patterned using conventional photolithography methods. Referring to FIG. 4, sacrificial layer 66 is subjected to a dry etch by, for example, reactive ion etching (RIE) using a $CHF_3$, $CF_4$, or $SF_6$ chemistry, to form a plurality of hard mask sacrificial members 68.

The intermediate layer 52 then is etched to expose second silicon oxide layer 62 of charge trapping stack 58. The intermediate layer 52 can be etched in the desired pattern and the photoresist then is removed.

Figure 5:
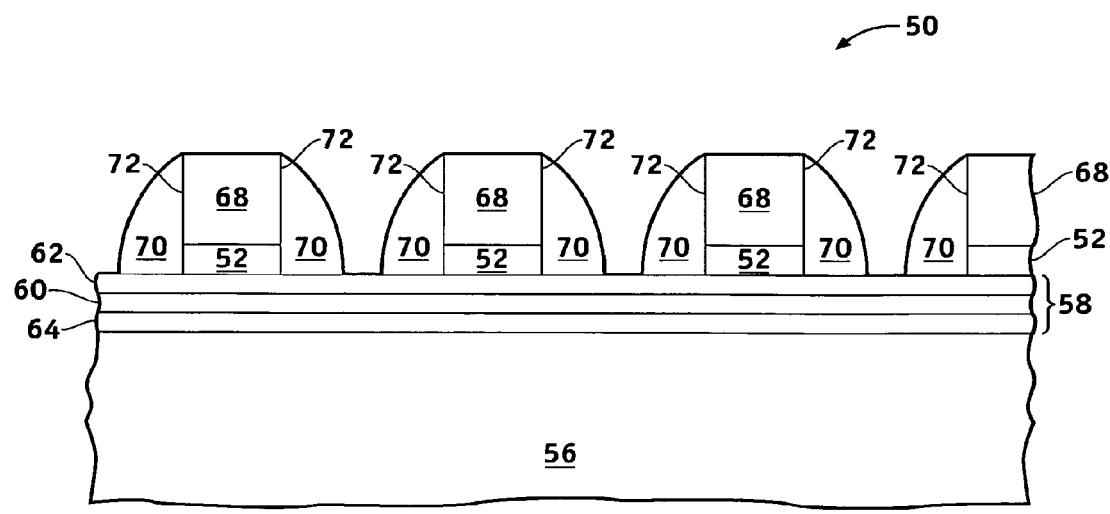
Figure 6:
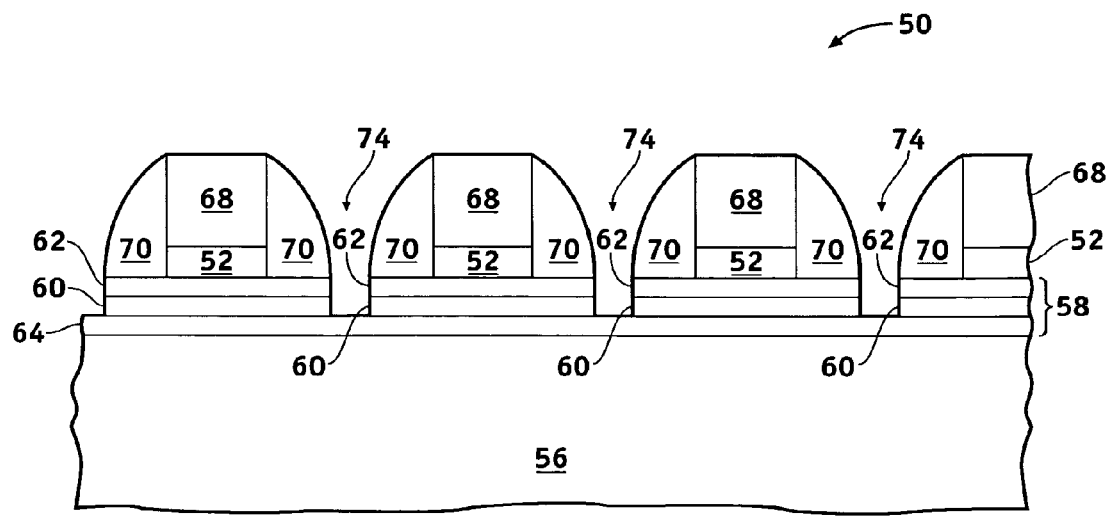

Referring to FIG. 5, a layer of material that is different from the material of sacrificial layer 66 and second silicon oxide layer 62, such as, for example, a silicon nitride or a polymer, is conformally deposited overlying memory device 50 and is etched to form sidewall spacers 70 about sidewalls 72 of sacrificial members 68. Using sidewall spacers 70 and sacrificial members 68 as a mask, second silicon oxide layer 62 and charge trapping layer 60 are etched by an anisotropic etch process to form openings 74 in charge trapping layer 60, thus exposing tunnel oxide layer 64, as illustrated in FIG. 6.

Figure 7:
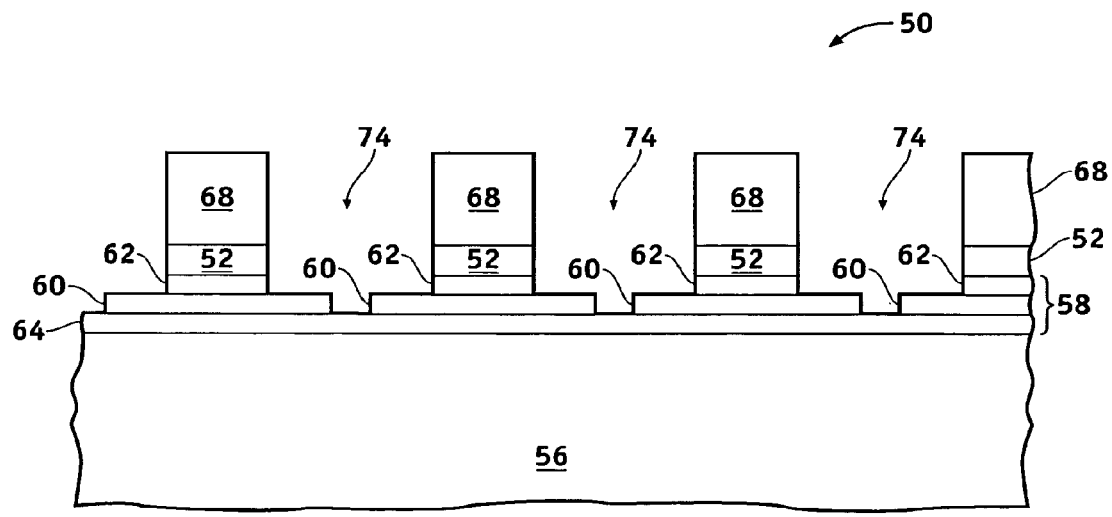
Figure 8:
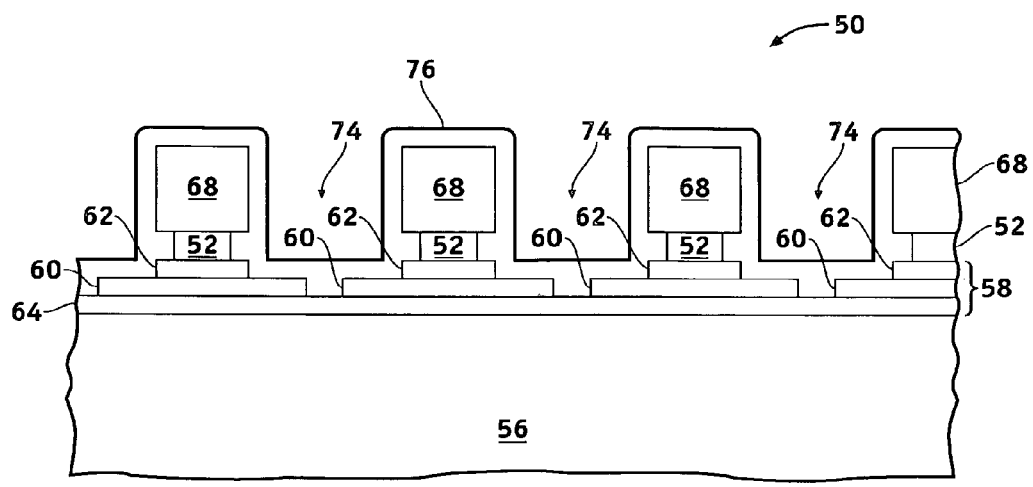

Referring to FIG. 7, the sidewall spacers 70 are removed by either a wet clean process or a dry etch process, which also removes portions of second silicon oxide layer 62 that do not underlie sacrificial members 68. Referring to FIG. 8, a silicon oxide layer 76 is globally formed overlying memory device 50 and within openings 74. In an exemplary embodiment of the invention, the silicon oxide layer 76 may be deposited using any of the above-described methods for depositing a silicon oxide layer and is deposited to a thickness in the range of about 30 to about 300 angstroms. In another exemplary embodiment of the invention, the silicon oxide deposition process is followed by a subsequent thermal oxidation process, as is well known in the art. The thermal oxidation process increases the thickness and the density of the oxide within openings 74. In an exemplary embodiment of the invention, the thermal oxidation results in a silicon oxide thickness above tunnel oxide layer 64 within openings 74 of about 100 to about 400 angstroms.

Figure 9:
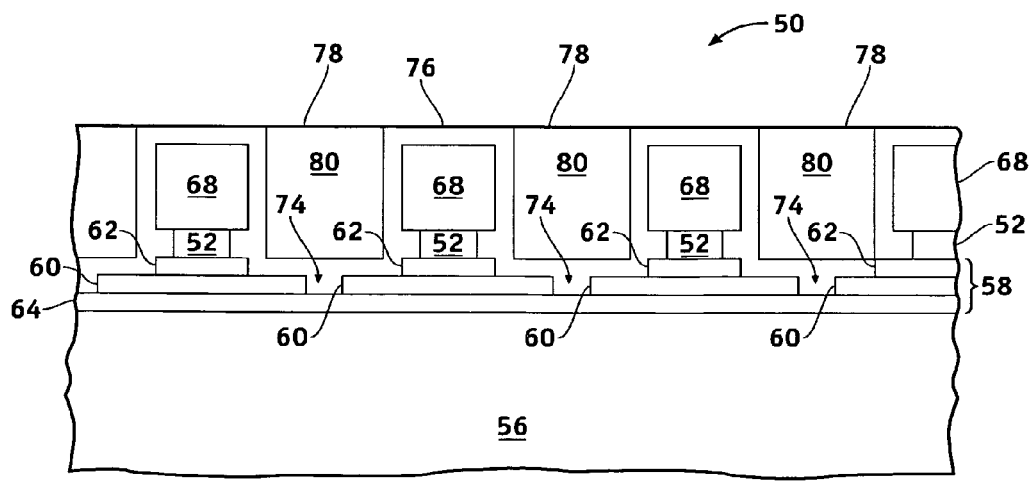

In accordance with an embodiment of the invention, a layer, preferably of polycrystalline silicon 78, or, in the alternative, metal or other conductive material, is deposited overlying the silicon oxide layer 76. The polycrystalline silicon layer 78 is subjected to a dry etch process, for example, a plasma etching in a Cl or $HBr/O_2$ chemistry, to expose silicon oxide layer 76 and to form control gates 80 that are disposed between hard mask sacrificial members 68 and that overlie openings 74, as illustrated in FIG. 9.

Figure 10:
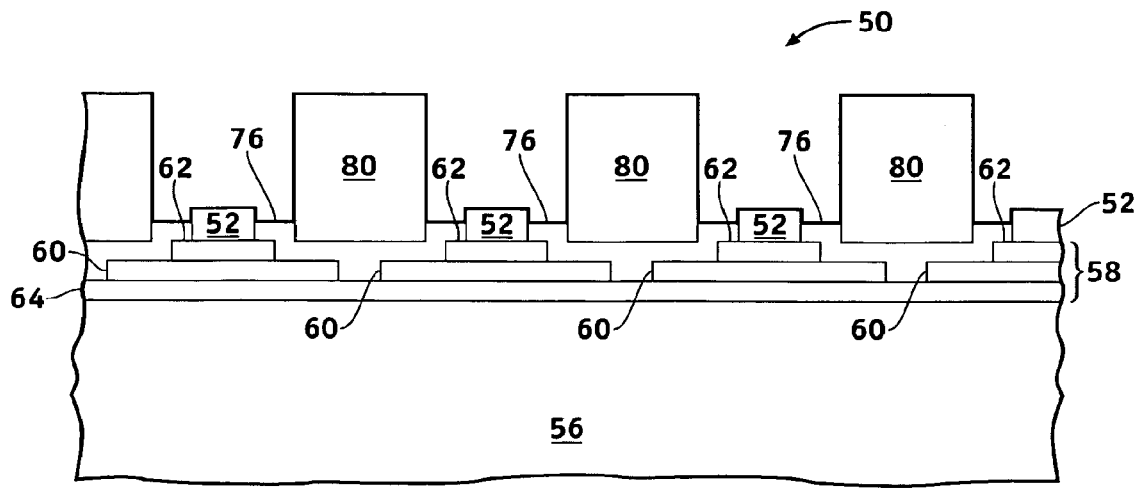
Figure 11:
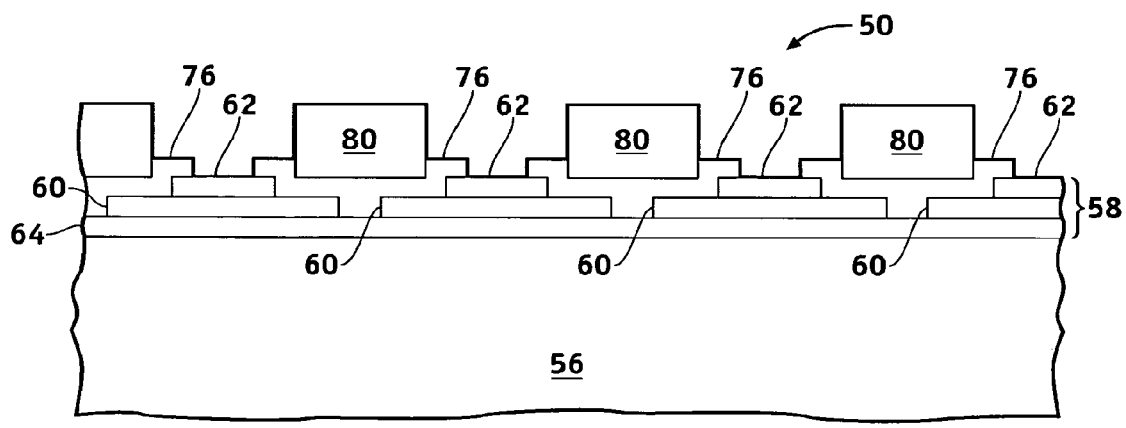
Figure 12:
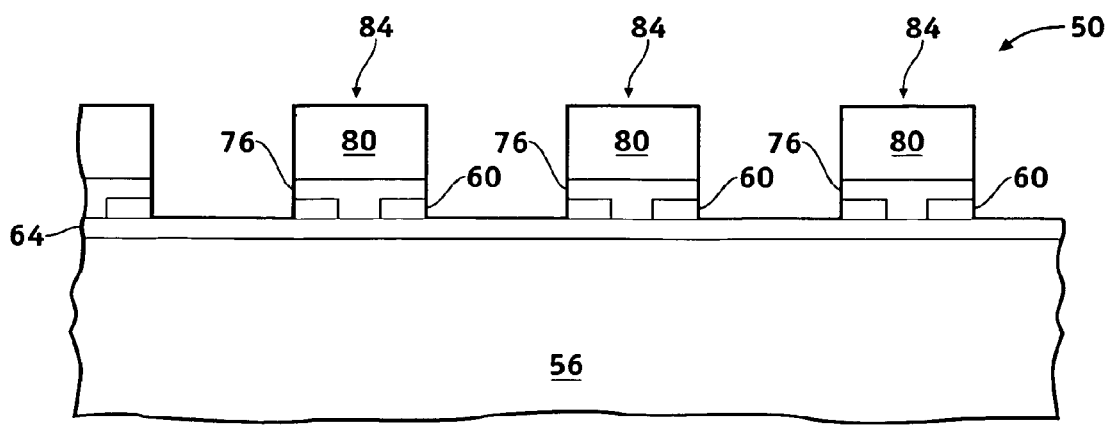
Figure 13:
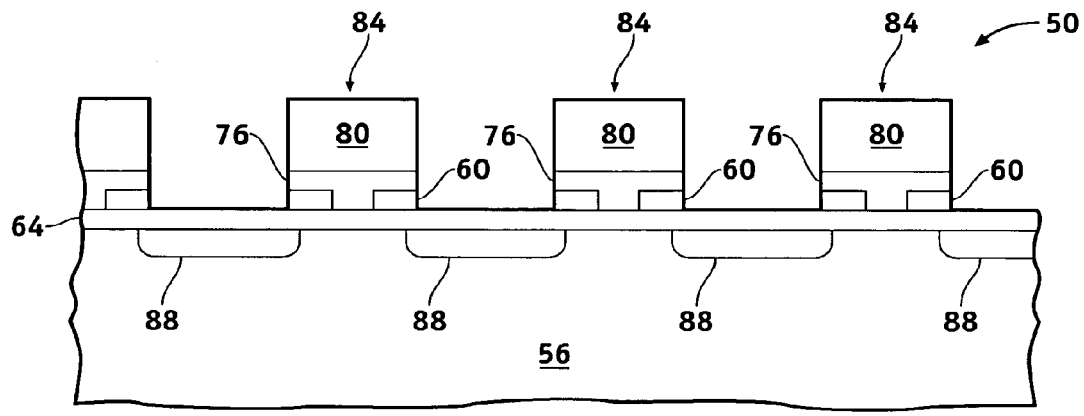

Referring to FIG. 10, the silicon oxide layer 76 and the hard mask sacrificial members 68 subsequently are etched to expose intermediate layer 52. The oxide materials may be etched by, for example, RIE using a $CHF_3$, $CF_4$, or $SF_6$ chemistry. Referring to FIG. 11, the intermediate layer 52 then is etched. Using control gates 80 as a mask, exposed portions of fourth silicon oxide layer 76, second silicon oxide layer 62, and charge trapping layer 60 are anisotropically etched to expose tunnel oxide 64 and to form gate stacks 84, as illustrated in FIG. 12. Layers 76, 62, and 60 may be etched by, for example, RIE using a $CHF_3$, $CF_4$, or $SF_6$ chemistry. Gate stacks 84 are used as an implantation mask to form bitline regions 88 in silicon substrate 56, as illustrated in FIG. 13. The bitline regions 88 are preferably formed by implanting an N-type impurity dopant, preferably arsenic ions or phosphorous ions.

Figure 14:
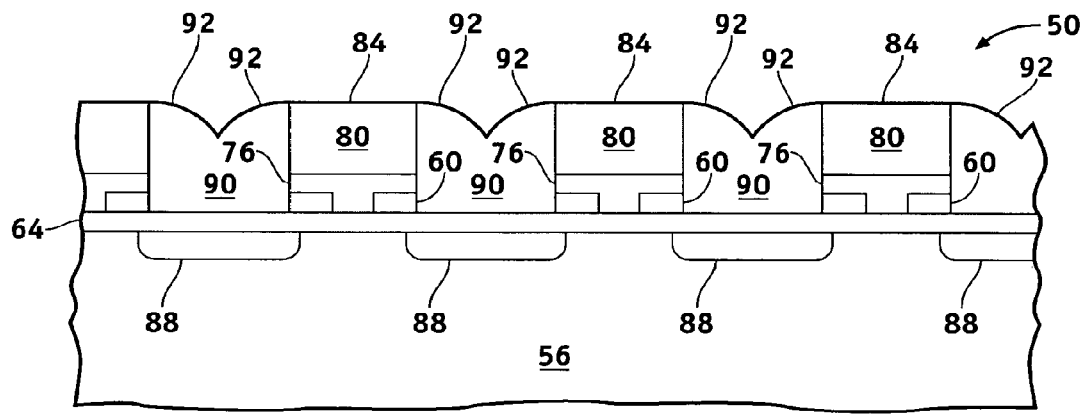
Figure 15:
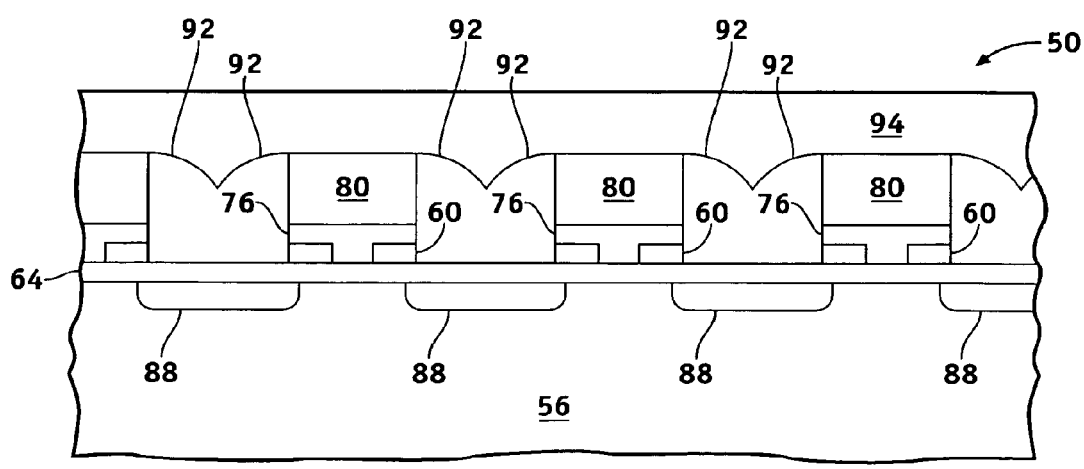

Referring to FIG. 14, in an exemplary embodiment of the invention, an insulating layer 90, preferably a silicon oxide layer, is conformally deposited overlying memory device 50 and is anisotropically etched to form bitline spacers 92. In an exemplary embodiment of the present invention, the silicon oxide layer 90 is deposited to a thickness such that, upon etching, bitline spacers 92 completely cover exposed portions of bitline regions 88, thus insulating the bitline regions. Referring to FIG. 15, in another exemplary embodiment of the present invention, a polycrystalline silicon layer 94 may be globally deposited overlying memory device 50 to cover control gates 80 and bitline spacers 92.

Accordingly, a method for fabricating a dual bit memory device has been provided. The method provides for formation of the bitline regions after fabrication of the memory cell gate stacks, thus avoiding exposure of the bitline regions to thermal cycles that otherwise would result in lateral diffusion of the bitline regions. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a dual bit memory device, the method comprising:
   fabricating a charge trapping stack overlying a substrate, wherein the charge trapping stack comprises a tunnel oxide layer, a charge trapping layer overlying the tunnel oxide layer, and an insulating layer overlying the charge trapping layer;
   forming a plurality of sacrificial members overlying the charge trapping layer;
   etching isolation openings within the charge trapping layer between adjacent sacrificial members of the plurality of sacrificial members;
   globally depositing an oxide layer overlying the plurality of sacrificial members, within the isolation openings, and overlying portions of the charge trapping layer;
   forming a plurality of control gates overlying each of the isolation openings;
   removing the plurality of sacrificial members;
   etching portions of the oxide layer and the charge trapping layer that do not underlie the plurality of control gates; and
   forming a plurality of impurity doped bitline regions within the substrate using the plurality of control gates as a mask.

2. The method of claim 1, wherein the step of forming a plurality of sacrificial members overlying the charge trapping layer comprises the steps of:
   depositing an intermediate layer overlying the charge trapping layer;
   depositing a sacrificial layer overlying the intermediate layer;
   removing a portion of the sacrificial layer to form the plurality of sacrificial members; and
   removing portions of the intermediate layer that do not underlie the sacrificial members.

3. The method of claim 2, further comprising the step of forming sidewall spacers about sidewalls of each of the plurality of sacrificial members after the step of forming a plurality of sacrificial members overlying the charge trapping layer.

4. The method of claim 3, wherein the step of forming sidewall spacers comprises the step of forming sidewall spacers of a material that is different from the sacrificial layer and the insulating layer.

5. The method of claim 4, wherein the step of etching isolation openings within the charge trapping layer between adjacent sacrificial members of the plurality of sacrificial members comprises the step of etching the isolation openings using the sacrificial members and the sidewall spacers as a mask.

6. A method for fabricating a flash memory device, the method comprising:
fabricating a charge trapping stack overlying a silicon substrate, wherein the charge trapping stack comprises a first dielectric layer, a charge trapping layer overlying the first dielectric layer, and a second dielectric layer overlying the charge trapping layer;
depositing an intermediate layer overlying the second dielectric layer;
depositing a sacrificial layer overlying the intermediate layer;
removing portions of the sacrificial layer to form a plurality of sacrificial members;
etching the intermediate layer to expose portions of the second dielectric layer that do not underlie the sacrificial members;
etching isolation openings through the second dielectric layer and the charge trapping layer using the sacrificial members as a mask;
depositing a first insulating material overlying the sacrificial members and within the isolation openings;
fabricating control gates between adjacent sacrificial members of the plurality of sacrificial members;
removing the sacrificial members;
removing the intermediate layer;
etching the first insulating material and the charge trapping layer using the control gates as a mask; and
forming impurity doped bitline regions within the substrate using the control gates as an implantation mask.

7. The method of claim 6, further comprising the steps of:
conformally depositing a second insulating material layer overlying the control gates and the impurity doped bitline regions; and
etching the insulating material layer to form bitline spacers between adjacent control gates.

8. The method of claim 6, further comprising the step of forming sidewall spacers about the sidewalls of each of the plurality of sacrificial members after the step of etching the intermediate layer to expose portions of the second dielectric layer that do not underlie the sacrificial members, and wherein the step of etching isolation openings through the second dielectric layer and the charge trapping layer using the sacrificial members as a mask comprises the step of etching the isolation openings using the sacrificial members and the sidewall spacers as a mask.

9. The method of claim 6, wherein the step of fabricating a charge trapping stack overlying a silicon substrate comprises the steps of depositing a first silicon oxide layer overlying the substrate, a silicon-rich silicon nitride layer overlying the first silicon oxide layer, and a second silicon oxide layer overlying the silicon-rich silicon nitride layer.

10. The method of claim 3, wherein the step of forming sidewall spacers comprises the step of forming sidewall spacers of silicon nitride.

11. The method of claim 8, wherein the step of forming sidewall spacers comprises the step of forming sidewall spacers of silicon nitride.

12. The method of claim 2, wherein the step of depositing an intermediate layer comprises depositing a polycrystalline silicon layer.

13. The method of claim 2, wherein the step of depositing a sacrificial layer comprises depositing a silicon oxide layer.

14. The method of claim 6, wherein the step of depositing an intermediate layer comprises depositing a polycrystalline silicon layer.

15. The method of claim 6, wherein the step of depositing a sacrificial layer comprises depositing a silicon oxide layer.

* * * * *